United States Patent [19]

Unozawa

[11] Patent Number: 5,780,879
[45] Date of Patent: Jul. 14, 1998

[54] FIELD-EFFECT TRANSISTOR AND METHOD OF MANUFACTURING THE SAME

[75] Inventor: Kosei Unozawa, Tokyo, Japan

[73] Assignee: NEC Corporation, Tokyo, Japan

[21] Appl. No.: 866,267

[22] Filed: May 30, 1997

[30] Foreign Application Priority Data

May 30, 1996 [JP] Japan ................................. 8-136513

[51] Int. Cl.$^6$ ................................................ H01L 31/0328
[52] U.S. Cl. ................................................ 257/192; 257/615
[58] Field of Search .............................. 257/192, 191, 257/194, 615

[56] References Cited

FOREIGN PATENT DOCUMENTS 4-326734  11/1992  Japan .

*Primary Examiner*—Mark V. Prenty
*Attorney, Agent, or Firm*—Sughrue, Mion, Zinn, Macpeak & Seas, PLLC

[57] ABSTRACT

An FET includes a semi-insulating GaAs substrate, a buffer layer, a first graded layer, a channel layer, a second graded layer, a cap layer, source and drain electrodes, and a gate electrode. The buffer layer consists of a high-resistance semiconductor crystal exhibiting lattice matching with GaAs and is formed on the substrate. The first graded layer consists of an $(Al_zGa_{1-z})_{1-x}In_xP$ semiconductor crystal and is formed on the buffer layer such that the In content is gradually increased with distance from the buffer layer. The channel layer consists of an $In_yGa_{1-y}As$ semiconductor crystal and is formed on the graded layer. The second graded layer consists of an $(Al_zGa_{1-z})_{1-x}In_xP$ semiconductor crystal and is formed on the channel layer such that the In content is gradually decreased with distance from the channel layer. The cap layer consists of GaAs and is formed on the second graded layer. The source and drain electrodes are formed on the cap layer. The gate electrode is formed between the source and drain electrodes by removing the cap layer. An Al content z of each graded layer is 0 to 0.5. An In content y of the channel layer is 0.2 to 0.6. A method of manufacturing this FET is also disclosed.

8 Claims, 4 Drawing Sheets

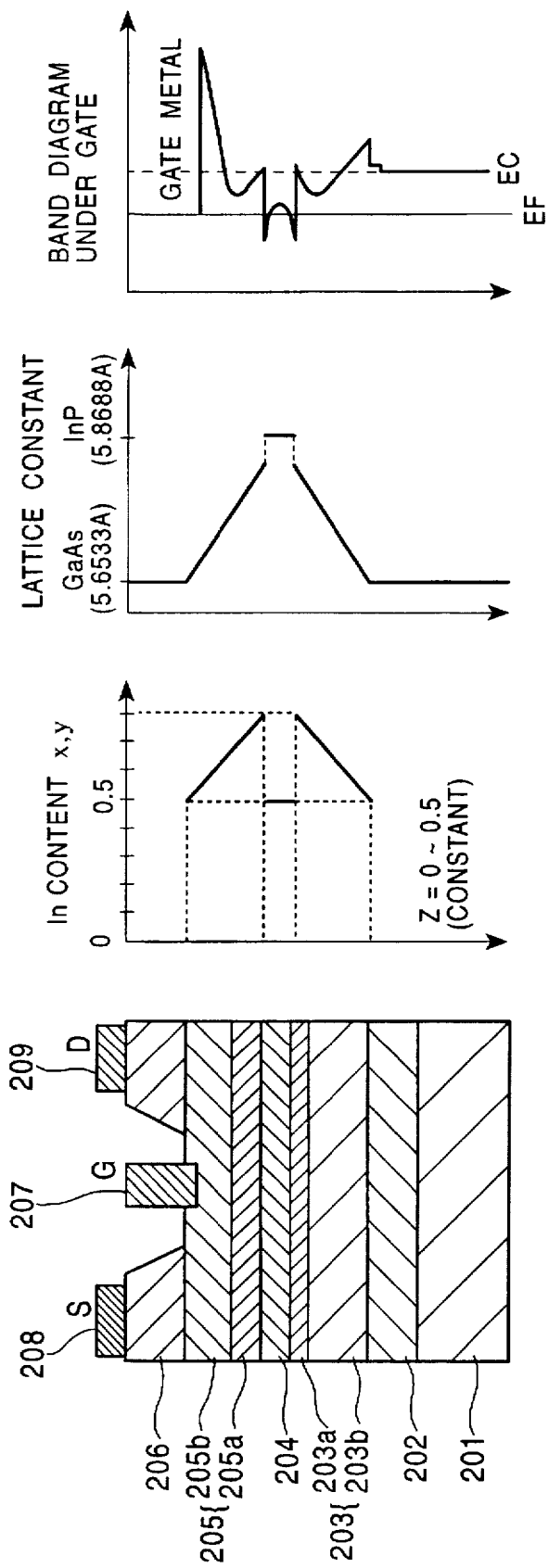

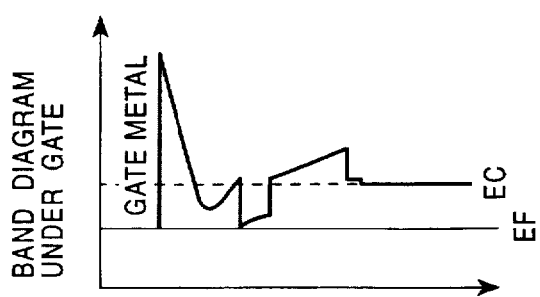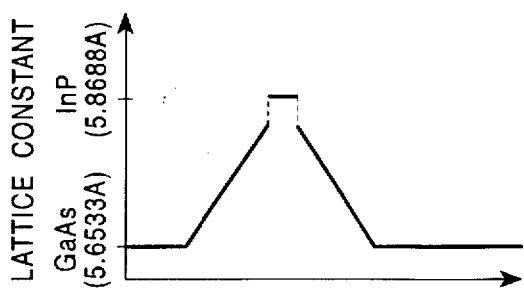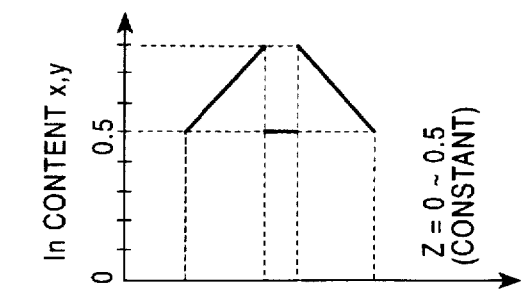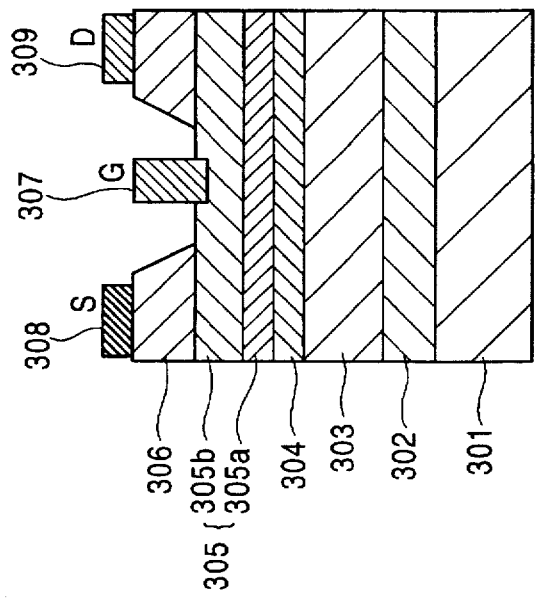

FIELD-EFFECT TRANSISTOR AND METHOD OF MANUFACTURING THE SAME

BACKGROUND OF THE INVENTION

1. Field of the Invention

The present invention relates to a field-effect transistor (to be referred to as an FET hereinafter) having a channel layer consisting of InGaAs and, more particularly, to an FET which operates at a high frequency and a method of manufacturing the same.

2. Description of the Prior Art

It is known that InGaAs has a high electron mobility, which can be further increased by increasing the In content. For this reason, studies have been made to use InGaAs for the channel layer of an FET.

However, a GaAs substrate differs in lattice constant from InGaAs. For this reason, when an InGaAs layer is to be directly grown on a GaAs substrate, as the In content increases, the lattice mismatch increases. As a result, crystal growth for the InGaAs layer is difficult to take place. Even if the In content is decreased, a thick film cannot be grown.

A conventional technique of solving the above problem is disclosed in Japanese Unexamined Patent Publication No. 4-326734. This technique will be described below with reference to FIG. 1.

FIG. 1 is a sectional view showing an example of the structure of a conventional FET. According to this prior art, a 50-nm thick buffer layer 402 consisting of undoped GaAs is formed on a GaAs substrate 401. A 5-nm thick first graded layer 403 consisting of undoped $In_yGa_{1-y}As$ is formed on the buffer layer 402 such that an In content y is gradually increased from 0 and set to 0.15 at the uppermost surface level. A 5-nm thick channel layer 404 consisting of an n-type $In_yGa_{1-y}As$ (y=0.15, n=4×10$^{18}$ cm$^{-3}$) uniformly doped with Si is formed on the first graded layer 403. A 5-nm thick second graded layer 405 consisting of $In_yGa_{1-y}As$ is formed on the channel layer 404 such that the In content y is gradually decreased from 0.15 and set to 0 at the lowermost surface level. A 40-nm thick cap layer 406 consisting of GaAs is formed on the second graded layer 405. A gate electrode 407, a source electrode 408, and a drain electrode 409 are formed on the cap layer 406.

In the above conventional FET having the channel layer 404 sandwiched between the first and second graded layers 403 and 405, since the channel layer 404 has the same crystal composition as that of the graded layers 403 and 405 sandwiching the channel layer 404, the bands at the interfaces between the channel layer and the graded layers exhibit gradual changes, resulting in poor effect of confining electrons in the channel layer. That is, electrons flowing near the channel layer merge with electrons flowing in the channel, and a high transconductance cannot be expected owing to the influence of the low saturation electron speed of the channel layer heavily doped with Si.

SUMMARY OF THE INVENTION

The present invention has been made to solve the above problem in the prior art, and has as its object to provide an FET having good FET characteristics, which exhibits a great effect of confining electrons in the channel layer, and a high mobility.

In order to achieve the above object, according to the basic aspect of the present invention, there is provided a field-effect transistor comprising a semi-insulating GaAs substrate, a buffer layer essentially consisting of a high-resistance semiconductor crystal exhibiting lattice matching with GaAs and formed on the semi-insulating GaAs substrate, a first graded layer essentially consisting of an $(Al_zGa_{1-z})_{1-x}In_xP$ semiconductor crystal and formed on the buffer layer such that an In content is gradually increased with distance from the buffer layer, a channel layer essentially consisting of an $In_yGa_{1-y}As$ semiconductor crystal and formed on the first graded layer, a second graded layer essentially consisting of an $(Al_zGa_{1-z})_{1-x}In_xP$ semiconductor crystal and formed on the channel layer such that an In content is gradually decreased with distance from the channel layer, a cap layer consisting of GaAs and formed on the second graded layer, source and drain electrodes formed on the cap layer, and a gate electrode formed between the source and drain electrodes by removing the cap layer, wherein an Al content z of the first and second graded layers falls within a range of 0 to 0.5, and an In content y of the channel layer falls within a range of 0.2 to 0.6.

According to the second aspect of the present invention, the electric-field transistor according to the basic aspect is characterized in that the In contents of the first and second graded layers at interfaces with the channel layer are controlled such that band gaps of both the first and second graded layers at the interfaces with the channel layer are higher than a band gap of the channel layer.

According to the third aspect of the present invention, the electric-field transistor according to the basic and second aspects is characterized in that at least one of the first and second graded layers has an n-type doped electron donor layer on a channel side.

According to the fourth aspect of the present invention, the electric-field transistor according to the basic and second aspects is characterized in that the second graded layer has an n-type doped electron donor layer on a channel layer side, and the channel layer is an n-type doped channel layer.

According to the fifth aspect of the present invention, there is provided a method of manufacturing the field-effect transistor defined in any one of the above aspects of the present invention, comprising the steps of forming a recess by etching a predetermined portion of a cap layer using a phosphoric-acid-based etching solution, and forming a gate electrode in the recess.

According to the present invention, although the Al content z of each of the first and second graded layers must fall within the range of 0 to 0.5, each graded layer more preferably contains Al within the range in which the Al content does not exceed 0.5.

In addition, the In content y of the channel layer must fall within the range of 0.2 to 0.6, but more preferably falls within the range of 0.5 to 0.6 in terms of lattice matching.

According to the sixth aspect of the present invention, there is provided a method of manufacturing a field-effect transistor, comprising the steps of:

(a) forming a buffer layer essentially consisting of undoped GaAs and undoped $Al_{0.2}Ga_{0.8}As$ on a semi-insulating GaAs substrate;

(b) forming a first graded layer essentially consisting of an $(Al_zGa_{1-z})_{1-x}In_xP$ semiconductor crystal exhibiting lattice matching with the GaAs on the buffer layer such that an In content is gradually increased with distance from the buffer layer;

(c) forming a channel layer essentially consisting of an $In_yGa_{1-y}As$ semiconductor crystal on the first graded layer;

(d) forming a second graded layer essentially consisting of an $(Al_zGa_{1-z})_{1-x}In_xP$ semiconductor crystal on the channel layer such that an In content is gradually decreased with distance from the channel layer;

(e) forming a cap layer essentially consisting of Si-doped GaAs (n-type GaAs) on the second graded layer;

(f) partly etching the cap layer to form a recess, and forming a gate electrode in the recess; and (g) forming source and drain electrodes, each essentially consisting of an Ohmic electrode, on two cap layer portions left on both sides of the recess.

According to the seventh aspect of the present invention, the method according to the sixth embodiment further comprises the step of forming an n-type electron donor layer on the channel layer side by performing doping in at least one of the graded layers after at least one of the steps of forming the first and second graded layers.

According to the eighth aspect of the present invention, in the method according to the sixth and seventh aspects, the step of forming the channel layer comprises the doping step of forming the channel layer into an n-type channel layer.

As is apparent from the above aspects, according to the present invention, the channel layer consisting of $In_yGa_{1-y}As$ is sandwiched between the graded layers each consisting of $(As_zGa_{1-x})_{1-x}In_xP$. With this structure, a high mobility can be obtained especially when undoped $In_yGa_{1-y}As$ is used for the channel layer.

In addition, if the channel layer is doped with an impurity as in the FET of the third embodiment, the sheet electron concentration (Ns) increases to prevent overcurrents. A high-output FET can therefore be obtained.

Since the channel layer of the FET of the present invention is sandwiched between the graded layers each consisting of $(As_zGa_{1-x})_{1-x}In_xP$ higher in band gap than the channel layer, a great electron confinement effect can be obtained. The sheet electron concentration (Ns) can therefore be increased.

In addition, owing to the band gap difference between the channel layer and the graded layer on the substrate side, the leakage current to the substrate can be reduced.

In the FET of the present invention, the crystal composition ratios of the graded layers are graded, and the buffer layer has a double-layer structure. For these reasons, the lattice matching characteristics between the GaAs substrate and the channel layer are improved. Furthermore, owing to the double-layer structure of the buffer layer, the leakage current to the substrate side is suppressed, thereby reducing the side gate effect and the back gate effect.

As a result, good FET characteristics were obtained. For example, the transconductance (gm) fell within the range of 400 to 500 mS/mm, and the drain conductance (gd) fell within the range of 0.008 to 0.13 mS/mm.

In the FET manufacturing process, when a phosphoric-acid-based solution was used as an etching solution for etching the cap layer to form the recess, since there was about fifty-fold difference in etching rate between the cap layer and the graded layers, selective etching was easy to perform. In addition, the FET of the present invention uses the GaAs substrate, and the InGaAs layer exhibiting lattice matching with InP is stacked on the substrate. With this structure, a transistor, an IC, or the like can be manufactured at a lower cost than with a structure using an InP substrate.

The above and many other advantages, features and additional objects of the present invention will become manifest to those versed in the art upon making reference to the following detailed description and accompanying drawings in which preferred embodiments incorporating the principles of the present invention are shown by way of illustrative example.

BRIEF DESCRIPTION OF THE DRAWINGS

FIGS. 3A to 3D are a sectional view showing a semiconductor crystal structure, a graph showing the In content, a graph showing the lattice constant, and a band diagram under the gate, respectively, according to the second embodiment of the present invention; and FIGS. 4A to 4D are a sectional view showing a semiconductor crystal structure, a graph showing the In content, a graph showing the lattice constant, and a band diagram under the gate, respectively, according to the third embodiment of the present invention.

DETAILED DESCRIPTION OF THE PREFERRED EMBODIMENTS

Several preferred embodiments of the present invention will be described below with reference to the accompanying drawings.

Figure 1:
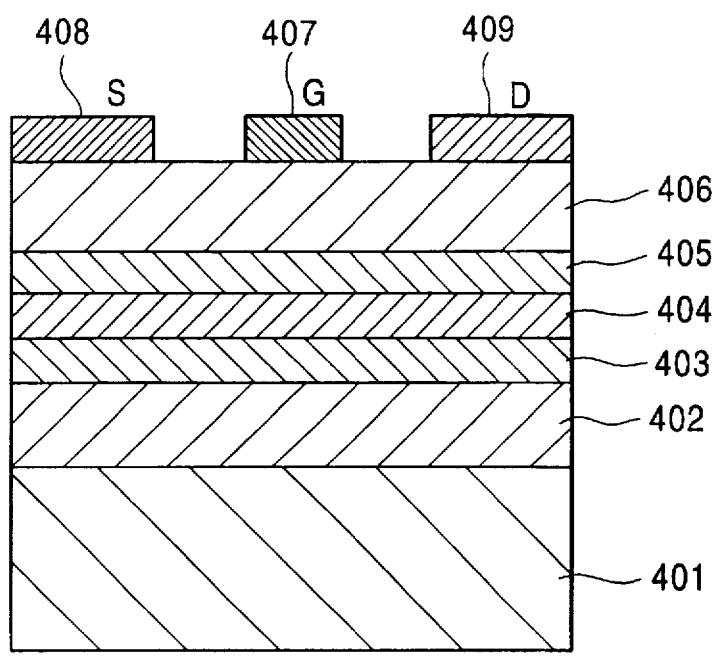
FIG. 1 is a sectional view showing the semiconductor crystal structure of a conventional field-effect transistor.
Figure 2D:
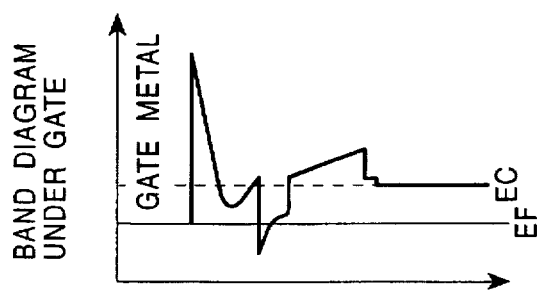
FIGS. 2A to 2D are a sectional view showing a semiconductor crystal structure, a graph showing the In content, a graph showing the lattice constant, and a band diagram under the gate, respectively, according to the first embodiment of the present invention.
Figure 2C:
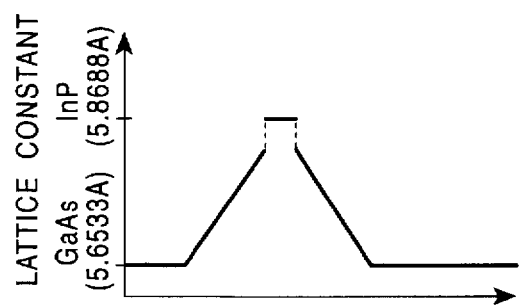
Figure 2B:
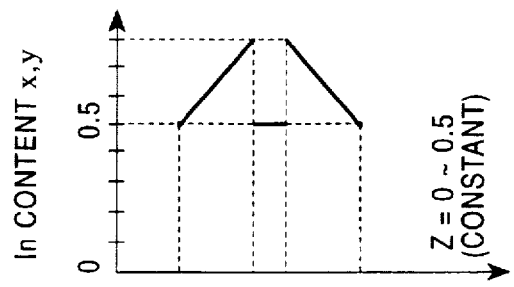
Figure 2A:
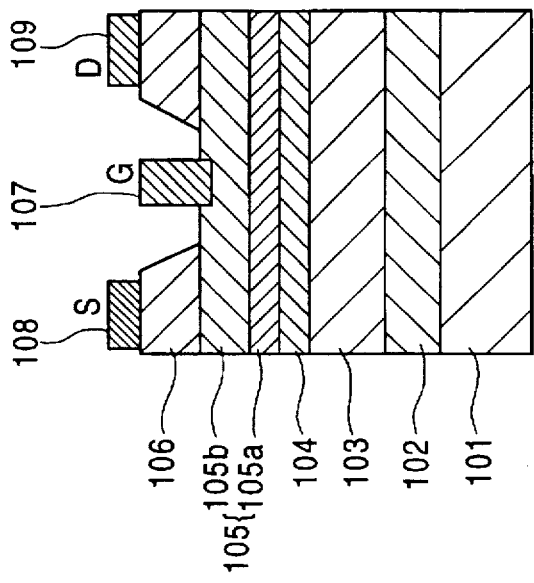

FIGS. 2A to 2D respectively show the semiconductor crystal multilayered structure (FIG. 2A) of an FET according to the first embodiment of the present invention, the In content in the multilayered structure (FIG. 2B), the lattice constant (FIG. 2C), the band diagram under the gate (FIG. 2D). Referring to FIGS. 2A to 2D, reference symbol EF denotes a Fermi level, and EC, a conduction level. Aluminum, tungsten silicide, or the like is used for the gate metal.

The semiconductor crystal according to the first embodiment is formed as follows. First of all, a buffer layer 102 consisting of a 300-nm thick undoped GaAs (background concentration $p \leq 2 \times 10^{-15}$ cm$^{-3}$) film and a 100-nm thick undoped $Al_{0.2}Ga_{0.8}As$ (background concentration $p \leq 3 \times 10^{-15}$ cm$^{-3}$) is formed on a semi-insulating GaAs |100| substrate 101 by, for example, a metal organic vapor-phase epitaxy method (to be referred to as an "MOVPE method" hereinafter). A 50-nm thick undoped first graded layer 103 is formed on the buffer layer 102 such that the In content of $(Al_zGa_{1-z})_{0.5}In_{0.5}P$ (for example, z=0.4), which exhibits lattice matching with GaAs, is gradually increased to that of $(Al_zGa_{1-z})_{0.2}In_{0.8}P$. A 13-nm thick channel layer 104 consisting of undoped $In_{0.5}Ga_{0.5}As$ is formed on the first graded layer 103. A 50-nm thick second graded layer 105 is formed on the channel layer 104 such that the In content of $(Al_zGa_{1-z})_{0.2}In_{0.8}P$ (for example, z=0.4) is gradually decreased to that of $(Al_zGa_{1-z})_{0.5}In_{0.5}P$. Of the second graded layer 105, the 15-nm thick region on the channel layer side is doped with Si at n=$3 \times 10^{18}$ cm$^{-3}$ to form an n-type electron donor layer 105a, and the remaining 35-nm thick region is doped with Si at n=$1 \times 10^{17}$ cm$^{-3}$ to form an n-type graded layer 105b. An 80-nm thick cap layer 106 consisting of GaAs (n-type GaAs) doped with Si at n=$3 \times 10^{18}$ cm$^{-3}$ is then formed. The cap layer 106 is partly etched to form a recess. A gate electrode 107 is formed in this recess. Ohmic electrodes are formed the two remaining cap layer portions on the two sides of the gate electrode to form a source electrode 108 and a drain electrode 109.

As the etching solution used to partly etch the cap layer to form the recess, a phosphoric-acid-based solution (aqueous $H_3PO4$ solution/aqueous $H_2O_2$ solution/$H_2O$=1/

1/3 (volume ratio)) was used. The etching rate of GaAs was 1.8 μm/min, and that of $(Al_{0.4}Ga_{0.6})_{0.5}In_{0.5}P$ was 0.9 μm/min. Selective etching was therefore easy to perform. Note that a general phosphoric-acid-based etching solution other than the solution having the above composition can also be used.

FIGS. 3A to 3D respectively show the semiconductor crystal multilayered structure (FIG. 3A) of an FET according to the second embodiment of the present invention, the In content in the multilayered structure (FIG. 3B), the lattice constant (FIG. 3C), and the band diagram under the gate (FIG. 3D).

The semiconductor crystal according to the second embodiment is formed as follows. First of all, a buffer layer 202 consisting of a 300-nm thick undoped GaAs (background concentration $p \leq 2 \times 10^{-15}$ cm$^{-3}$) film and a 100-nm thick undoped $Al_{0.2}Ga_{0.8}As$ (background concentration $p \leq 3 \times 10^{-15}$ cm$^{-3}$) is formed on a semi-insulating GaAs [100] substrate 201 by, for example, an MOVPE method. A 50-nm thick undoped first graded layer 203 is formed on the buffer layer 202 such that the In content of $(Al_zGa_{1-z})_{0.5}In_{0.5}P$ (for example, z=0.4), which exhibits lattice matching with GaAs, is gradually increased to that of $(Al_zGa_{1-z})_{0.2}In_{0.8}P$. Of the first graded layer 203, the 45-nm thick region on the buffer layer side is formed as an undoped graded layer 203b, and the remaining 5-nm thick region is doped with Si at $n=3 \times 10^{18}$ cm$^{-3}$ to form an n-type electron donor layer 203a. A 13-nm thick channel layer 204 consisting of undoped $In_{0.5}Ga_{0.5}As$ is formed on the first graded layer 203. A 50-nm thick second graded layer 205 is formed on the channel layer 204 such that the In content of $(Al_zGa_{1-z})_{0.2}In_{0.8}P$ (for example, z=0.4) is gradually decreased to that of $(Al_zGa_{1-z})_{0.5}In_{0.5}P$. Of the second graded layer 205, a 12-nm thick region on the channel layer side is doped with Si at $n=3 \times 10^{18}$ cm$^{-3}$ to form an n-type electron donor layer 205a, and the remaining 38-nm thick region is doped with Si at $n=1 \times 10^{17}$ cm$^{-3}$ to form an n-type graded layer 205b. An 80-nm thick cap layer 206 consisting of GaAs (n-type GaAs) doped with Si at $n=3 \times 10^{18}$ cm$^{-3}$ is then formed. The cap layer 206 is partly etched to form a recess. A gate electrode 207 is formed in this recess. Ohmic electrodes are formed on the two remaining cap layer portions on the two sides of the gate electrode to form a source electrode 208 and a drain electrode 209.

FIGS. 4A to 4D respectively show the semiconductor crystal multilayered structure (FIG. 4A) of an FET according to the third embodiment of the present invention, the In content in the multilayered structure (FIG. 4B), the lattice constant (FIG. 4C), and the band diagram under the gate (FIG. 4D).

The semiconductor crystal according to the third embodiment is formed as follows. First of all, a buffer layer 302 consisting of a 300-nm thick undoped GaAs (background concentration $p \leq 2 \times 10^{-15}$ cm$^{-3}$) film and a 100-nm thick undoped $Al_{0.2}Ga_{0.8}As$ (background concentration $p \leq 3 \times 10^{-15}$ cm$^{-3}$) is formed on a semi-insulating GaAs [100] substrate 301 by, for example, an MOVPE method. A 50-nm thick undoped first graded layer 303 is formed on the buffer layer 302 such that the In content of $(Al_zGa_{1-z})_{0.5}In_{0.5}P$ (for example, z=0.4), which exhibits lattice matching with GaAs, is gradually increased to that of $(Al_zGa_{1-z})_{0.5}In_{0.8}P$. A 13-nm thick n-type channel layer 304 consisting of $In_{0.5}Ga_{0.5}As$ doped with Si at $n=1 \times 10^{18}$ cm$^{-3}$ is formed on the first graded layer 303. A 50-nm thick second graded layer 305 is formed on the channel layer 304 such that the In content of $(Al_zGa_{1-z})_{0.2}In_{0.8}P$ (for example, z=0.4) is gradually decreased to that of $(Al_zGa_{1-z})_{0.5}In_{0.5}P$. Of the second graded layer 305a, 15-nm thick region on the channel layer side is doped with Si at $n=3 \times 10^{18}$ cm$^{-3}$ to form an n-type electron donor layer 305a, and the remaining 35-nm thick region is doped with Si at $n=1 \times 10^{17}$ cm$^{-3}$ to form an n-type graded layer 305b. An 80-nm thick cap layer 306 consisting of GaAs (n-type GaAs) doped with Si at $n=3 \times 10^{18}$ cm$^{-3}$ is then formed. The cap layer 306 is partly etched to form a recess. A gate electrode 307 is formed in this recess. Ohmic electrodes are formed on the two remaining cap layer portions on the two sides of the gate electrode to form a source electrode 308 and a drain electrode 309.

According to the present invention, with the formation of the electron donor layer, electrons generated by the donor impurity in the doped region move into the channel layer and flow therein. As the carrier concentration of this electron donor layer increases, the current increases, and the distance between the gate and the channel decreases. The transconductance (gm) therefore increases.

According to the FETs of the first and second embodiments, since undoped $In_{0.5}Ga_{0.5}As$ was used for the channel layer, the mobility at room temperature was $1 \times 10^4$ cm$^2$/V.sec or more.

According to the first, second, and third embodiments, since the channel layer was sandwiched between the graded layers, each consisting of $(Al_zGa_{1-z})_{1-x}In_xP$ (for example, z=0.4) higher in band gap than the channel layer by about 0.8 eV, the electron confinement effect was high, and the sheet electron concentration (Ns) could be increased. For example, Ns=$3 \times 10^{12}$ cm$^2$ with the structure of the first embodiment; Ns=$4.5 \times 10^{12}$ cm$^2$ with the structure of the second embodiment; and Ns=$4.3 \times 10^{12}$ cm$^2$ with the structure of the third embodiment.

In addition, since the leakage current to the substrate can be reduced because of the band gap difference between the channel layer and the first graded layer (103, 203, 303) on the substrate side.

As a result, FETs having the FET characteristics, i.e., the maximum currents ($I_{max}$), the transconductances (gm), and the drain conductances (gd), shown in Table 1 were obtained.

Note that as the semiconductor crystal growth method of the present invention, a metal organic molecular-beam epitaxy (MOMBE) method can be used as well as the MOVPE method.

TABLE 1

|  | $I_{max}$ (mA/mm) | gm (mS/mm) | gd (mS/mm) |
| --- | --- | --- | --- |
| First Embodiment | 550 | 400 | 0.013 |
| Second Embodiment | 650 | 500 | 0.008 |
| Third Embodiment | 600 | 450 | 0.010 |

What is claimed is:

1. A field-effect transistor comprising a semi-insulating GaAs substrate, a buffer layer essentially consisting of a high-resistance semiconductor crystal exhibiting lattice matching with GaAs and formed on said semi-insulating GaAs substrate, a first graded layer essentially consisting of an $(Al_zGa_{1-z})_{1-x}In_xP$ semiconductor crystal and formed on said buffer layer such that an In content is gradually increased with distance from said buffer layer, a channel layer essentially consisting of an $In_yGa_{1-y}As$ semiconductor crystal and formed on said first graded layer, a second graded layer essentially consisting of an $(Al_zGa_{1-z})_{1-x}In_xP$ semiconductor crystal and formed on said channel layer such that an In content is gradually decreased with distance from said channel layer, a cap layer consisting of GaAs and formed on said second graded layer, source and drain electrodes formed on said cap layer, and a gate electrode formed between said source and drain electrodes by removing said cap layer, wherein an Al content z of said first and second graded layers falls within a range of 0 to 0.5, and an In content y of said channel layer falls within a range of 0.2 to 0.6.

2. A transistor according to claim 1, wherein the In contents of said first and second graded layers at interfaces with said channel layer are controlled such that band gaps of both said first and second graded layers at the interfaces with said channel layer are higher than a band gap of said channel layer.

3. A transistor according to claim 1, wherein at least one of said first and second graded layers has an n-type doped electron donor layer on a channel side.

4. A transistor according to claim 1, wherein said second graded layer has an n-type doped electron donor layer on a channel layer side, and said channel layer is an n-type doped channel layer.

5. A transistor according to claim 2, wherein said second graded layer has an n-type doped electron donor layer on the channel layer side, and said channel layer is an n-type doped channel layer.

6. A transistor according to claim 1, wherein each of said first and second graded layers contains Al within a range in which the Al content z does not exceed 0.5.

7. A field-effect transistor wherein an In content y of said channel layer falls within a range of 0.5 to 0.6.

8. A transistor according to claim 2, wherein at least one of said first and second graded layers has an n-type doped electron donor layer on a channel side.

* * * * *